United States Patent
Sabathil et al.

(10) Patent No.: US 9,978,734 B2
(45) Date of Patent: May 22, 2018

(54) LIGHT-EMITTING ARRANGEMENT AND METHOD OF PRODUCING A LIGHT-EMITTING ARRANGEMENT

(71) Applicant: OSRAM Opto Semiconductors GmbH, Regensburg (DE)

(72) Inventors: Matthias Sabathil, Regensburg (DE); Alexander Linkov, Regensburg (DE); Britta Göötz, Regensburg (DE); Georg Dirscherl, Tegernheim (DE)

(73) Assignee: OSRAM Opto Semiconductors GmbH (DE)

( * ) Notice: Subject to any disclaimer, the term of this patent is extended or adjusted under 35 U.S.C. 154(b) by 0 days. days.

(21) Appl. No.: 15/114,118

(22) PCT Filed: Jan. 26, 2015

(86) PCT No.: PCT/EP2015/051455
§ 371 (c)(1),
(2) Date: Jul. 26, 2016

(87) PCT Pub. No.: WO2015/113926
PCT Pub. Date: Aug. 6, 2015

(65) Prior Publication Data
US 2016/0351550 A1 Dec. 1, 2016

(30) Foreign Application Priority Data
Jan. 28, 2014 (DE) .................. 10 2014 100 991

(51) Int. Cl.
| H01L 25/16 | (2006.01) |
| H01L 31/173 | (2006.01) |
| H01L 25/00 | (2006.01) |
| H01L 33/50 | (2010.01) |
| H01L 33/56 | (2010.01) |
| H01L 33/44 | (2010.01) |

(52) U.S. Cl.
CPC ............ *H01L 25/167* (2013.01); *H01L 25/50* (2013.01); *H01L 31/173* (2013.01); *H01L 33/44* (2013.01);
(Continued)

(58) Field of Classification Search
CPC ..... H01L 25/167; H01L 25/50; H01L 31/173; H01L 33/44; H01L 33/504; H01L 33/508;
(Continued)

(56) References Cited

U.S. PATENT DOCUMENTS

| 7,151,283 | B2 | 12/2006 | Reeh et al. | |
| 2007/0085105 | A1 | 4/2007 | Beeson et al. | |
| 2010/0123386 | A1* | 5/2010 | Chen | H01L 33/58 313/502 |
| 2014/0048834 | A1 | 2/2014 | Sato et al. | |
| 2015/0346397 | A1* | 12/2015 | Linkov | G02B 5/0242 257/98 |
| 2016/0161067 | A1* | 6/2016 | Oepts | F21V 9/16 362/84 |

FOREIGN PATENT DOCUMENTS

| DE | 10 2007 059 548 A1 | 4/2009 |
| DE | 10 2012 212 320 A1 | 1/2014 |

(Continued)

*Primary Examiner* — Cuong Q Nguyen
*Assistant Examiner* — Tong-Ho Kim
(74) *Attorney, Agent, or Firm* — DLA Piper LLP (US)

(57) ABSTRACT

A light-emitting arrangement includes a radiation-emitting semiconductor chip that, during operation, emits primary radiation at least from a main emission surface, a first conversion element that absorbs part of the primary radiation and emits secondary radiation, and a deflection element that causes a direction change for part of the primary radiation, wherein the first conversion element is arranged in a lateral direction next to the radiation-emitting semiconductor chip, the deflection element guides part of the primary radiation onto the first conversion element, and the light-emitting arrangement, in operation, emits mixed light including the primary radiation and the secondary radiation.

11 Claims, 4 Drawing Sheets

(52) U.S. Cl.
CPC .......... *H01L 33/504* (2013.01); *H01L 33/508* (2013.01); *H01L 33/56* (2013.01); *H01L 2933/005* (2013.01); *H01L 2933/0033* (2013.01); *H01L 2933/0041* (2013.01); *H01L 2933/0091* (2013.01)

(58) Field of Classification Search
CPC ............. H01L 33/56; H01L 2933/0033; H01L 2933/0041; H01L 2933/005; H01L 2933/0091
USPC ..................................................... 257/82, 98
See application file for complete search history.

(56) References Cited

FOREIGN PATENT DOCUMENTS

| | | | |
|---|---|---|---|
| DE | 10 2012 217 643 A1 | 3/2014 | |
| JP | 2007-221044 A | 8/2007 | |
| JP | 2007221044 A * | 8/2007 | |
| WO | 2010/057019 A2 | 5/2010 | |
| WO | 2012/147608 A1 | 11/2012 | |
| WO | 2013/007696 A2 | 1/2013 | |
| WO | WO 2013007696 A2 * | 1/2013 | ........... H01L 33/507 |

* cited by examiner

LIGHT-EMITTING ARRANGEMENT AND METHOD OF PRODUCING A LIGHT-EMITTING ARRANGEMENT

TECHNICAL FIELD

This disclosure relates to a light-emitting arrangement.

BACKGROUND

U.S. Pat. No. 7,151,283 describes a light-emitting arrangement. However, there is a need to provide a light-emitting arrangement having a particularly long life and a light-emitting arrangement that can be produced in a particularly simple manner.

SUMMARY

We provide a light-emitting arrangement including a radiation-emitting semiconductor chip that, during operation, emits primary radiation at least from a main emission surface, a first conversion element that absorbs part of the primary radiation and emits secondary radiation, and a deflection element that causes a direction change for part of the primary radiation, wherein the first conversion element is arranged in a lateral direction next to the radiation-emitting semiconductor chip, the deflection element guides part of the primary radiation onto the first conversion element, and the light-emitting arrangement, in operation, emits mixed light including the primary radiation and the secondary radiation.

We also provide a method of producing a light-emitting arrangement, including providing a carrier including a top side, attaching a multitude of first conversion elements on the top side of the carrier, wherein the first conversion elements are arranged in a lateral direction spaced apart from one another, attaching an encapsulation on the top side of the carrier, wherein the encapsulation covers the carrier and the first conversion elements at least sectionally, removing the encapsulation in regions between the first conversion elements, and attaching optoelectronic semiconductor chips between the first conversion elements.

We further provide a light-emitting arrangement including a plurality of radiation-emitting semiconductor chips that, during operation, each emit primary radiation at least from a main emission surface, a first conversion element that absorbs part of the primary radiation and emits secondary radiation, and a deflection element that causes a direction change for part of the primary radiation, wherein the radiation-emitting semiconductor chips are arranged along a virtual line, the first conversion element is arranged in a lateral direction next to the radiation-emitting semiconductor chip, the first conversion element has a strip shape, the first conversion element is arranged parallel to and on both sides of the virtual line, the deflection element guides part of the primary radiation onto the first conversion element, and the light-emitting arrangement, in operation, emits mixed light including the primary radiation and the secondary radiation.

LIST OF REFERENCE NUMERALS 1 carrier
2 first conversion element
3 semiconductor body
4 second conversion element
5 semiconductor chip
51 main emission surface
6 primary radiation
7 secondary radiation
8 mixed light
9 deflection element
91 particles scattering radiation
92 matrix material
10 encapsulation
11 virtual line
12 frame
13 reflector
14 light guide

DETAILED DESCRIPTION

Our light-emitting arrangement may comprise a radiation-emitting semiconductor chip. The radiation-emitting semiconductor chip is a luminescence diode chip such as a light-emitting diode chip or a laser diode chip, for example. During operation, the radiation-emitting semiconductor chip emits primary radiation that may be in the wave length range from ultraviolet radiation to green light, for example. To that end, the radiation-emitting semiconductor chip comprises a main emission surface through which a major part, i.e. at least 50% of the emitted radiation exits from the radiation-emitting semiconductor chip. The main emission surface is formed by a cover surface of the radiation-emitting semiconductor chip, for example.

The arrangement may comprise a first conversion element that absorbs part of the primary radiation and emits secondary radiation. The secondary radiation has a lower energy than the primary radiation, for example. The conversion element may comprise exactly one type of phosphor or two or more types of phosphor. If the conversion element comprises two or more types of phosphor, the secondary radiation may therefore contain different peak wavelengths and thus different spectra.

The light-emitting arrangement may comprise a deflection element that brings about a direction change for at least part of the primary radiation. The direction change may be effected by scattering and/or refracting and/or reflecting the primary radiation. Preferably, the deflection element is arranged following the optoelectronic semiconductor chip such that a major part, i.e. at least 50%, or the entire primary radiation emitted by the semiconductor chip during operation through the main emission surface impinges the deflection element. At least part of the electromagnetic radiation is influenced by the deflection element by a direction change. The deflection element deflects the electromagnetic radiation, particularly in a targeted manner. That is, the deflected electromagnetic radiation does not constitute undesired scattered light, but rather the deflection element is adapted to deflect part of the electromagnetic radiation in a targeted manner.

The first conversion element may be arranged next to the radiation-emitting semiconductor chip in a lateral direction. The lateral direction runs parallel to the main emission surface of the radiation-emitting semiconductor chip, for example. In other words, the first conversion element is arranged next to the radiation-emitting semiconductor chip and is particularly not arranged on the main emission surface of the chip. It is possible that the first conversion element and the radiation emitting semiconductor chip are arranged in a noncontact manner to one another, thus particularly not being in direct contact to one another. A reflecting element or a reflecting layer may be arranged between them, for example. However, it is also possible for the first conversion element to directly adjoin a side surface of the radiation-emitting semiconductor chip running perpendicularly or transversely to the main emission surface.

The deflection element may guide part of the primary radiation onto the first conversion element. Guidance of the primary radiation may be at least effected by a one-time reflection, scattering and/or refraction of the primary radiation through the deflection element. In particular, the primary radiation does not enter the first conversion element directly from the radiation-emitting semiconductor chip, but rather the first conversion element is arranged next to the radiation emitting semiconductor chip so that at least part of the primary radiation initially enters and/or impinges the deflection element before the first conversion element is reached. That is, material of the first conversion element, e.g. a sensitive conversion substance, is not directly illuminated by the primary radiation, but the primary radiation impinges the material of the first conversion element only after being deflected in advance.

The deflection element preferably guides at least 25%, particularly preferably at least 50% of the electromagnetic primary radiation emitted by the semiconductor chip during operation onto the first conversion element. That is, in particular, at least 25% or at least 50% of the primary radiation impinges the first conversion element.

The light-emitting arrangement may emit mixed light comprising the primary radiation and the secondary radiation during operation. The mixed light may comprise further radiation parts that may originate from further conversion elements and/or further radiation-emitting semiconductor chips. However, the mixed light contains the primary radiation of the radiation-emitting semiconductor chip and the secondary radiation of the first conversion element.

The light emitting arrangement may comprise a radiation-emitting semiconductor chip which, during operation, emits primary radiation at least on a main emission surface, a first conversion element, that absorbs part of the primary radiation and emits secondary radiation, a deflection element, that brings about a direction change for at least part of the primary radiation, wherein the first conversion element is arranged in a lateral direction next to the radiation-emitting semiconductor chip, the deflection element guides part of the primary radiation onto the first conversion element and the light-emitting arrangement, during operation, emits mixed light comprising the primary radiation and the secondary radiation.

The light-emitting arrangement is based upon the following considerations: Radiation-sensitive or temperature-sensitive conversion materials that may be rapidly aging due to temperature or humidity that is too high, or conversion materials that, embedded in a matrix material such as silicone, only exhibit low efficiency can often times not be used in light-emitting arrangements due to the limitations described above. In our light-emitting arrangement, the first conversion material is laterally arranged next to the radiation-emitting semiconductor chip, which generates primary radiation. As a result, the luminance (density) of the occurring primary radiation can be reduced since the radiation may be distributed over a larger area than would be the case if the conversion element directly followed the semiconductor chip at the main emission surface thereof. Further, the first conversion element can be arranged on a well heat-conductive carrier together with the semiconductor chip, which allows improved heat dissipation of the heat generated during operation. There is no need for the first conversion element to be introduced into a matrix material, it may rather be directly attached to the carrier, for example. Further, encapsulation of the first conversion element may be provided, which may protect the conversion element against atmospheric gas and humidity without negatively influencing the dissipation of heat generated by the semiconductor chip during operation. Furthermore, the light-emitting arrangement described herein allows using silicone matrix materials that are more sensitive to temperature and/or radiation, which materials may be adjusted to the used phosphors in a better way. For example, the matrix materials may be adjusted to the used phosphors in a better way in terms of optical properties such as regarding the refractive index, and/or chemical properties.

Thus, a light-emitting arrangement described herein allows improved heat dissipation, light spreading and thus a reduction of the light-emitting diode of the primary radiation impinging the first conversion element and the possibility to encapsulate the first conversion element. As a result, even sensible converter materials may be used for the conversion element, which may be advantageous with regard to radiation characteristics, namely the wavelengths of the secondary radiation and their distribution with regard to their prices or with regard to their efficiency. As a result, despite using sensible converter materials, the light-emitting arrangement has a particularly long life.

The main emission surface of the semiconductor chip may be free of material of the first conversion element. That is, the first conversion element does not overlap and/or cover the main emission surface of the semiconductor chip. In particular, it is possible that the first conversion element and the semiconductor chip do not have any direct contact to one another in any location. This makes it possible that only deflected electromagnetic radiation that received a direction change by the deflection element is capable of impinging the first conversion element. In particular, the first conversion element is not directly radiated by the electromagnetic radiation of the semiconductor chip.

The semiconductor chip may comprise a second conversion element arranged following a semiconductor body of the semiconductor chip. Electromagnetic radiation is generated in the semiconductor body of the semiconductor chip by electric pumping, for example. In the second conversion element, radiation is generated by conversion and/or optical pumping. The primary radiation emitted by the semiconductor chip may have portions that have been generated directly in the semiconductor body and portions that have been generated in the second conversion element. In this case, the main emission surface of the semiconductor chip is formed by a region of the second conversion element, the region facing away from the semiconductor body. The second conversion element may comprise exactly one type of phosphor or two or more types of phosphor. If the second conversion element comprises two or more types of phosphor, the converted radiation may contain different peak wavelengths and thus different spectra.

For example, the second conversion element may cover the emission surface of the semiconductor body at least in some places so that electromagnetic radiation generated in the semiconductor body enters the second conversion element directly from the semiconductor body. At least one type of phosphor is used in the second conversion element, the phosphor not being contained in the first conversion element.

In other words, the first and the second conversion element may be different from one another particularly in terms of the phosphors used. For example, phosphors may be used for the second conversion element that have a higher resistance in terms of temperature and/or humidity. Sensible phosphors emitting electromagnetic radiation of a wavelength range different than that of the second conversion element may be arranged laterally next to the semiconductor chip spaced apart from the latter.

The deflection element may cover the semiconductor chip and the first conversion element at least in some places. For example, it is possible for the deflection element to completely cover the semiconductor chip and the first conversion element at their exposed outer surfaces. In this case, the deflection element may be in direct contact with the semiconductor chip and/or the first conversion element at least in some places so that the deflection element covers the semiconductor chip and/or the first conversion element at least in some places.

The deflection element may particularly comprise a light-scattering body. For example, the deflection element is formed with a matrix material with particles of a light-scattering, light-refracting and/or light-reflecting material being introduced therein. The deflection element may then be arranged following the semiconductor chip and the first conversion element by a potting process so that the two components are potted in the deflection element.

The light-emitting arrangement may comprise a carrier on the top side of which the semiconductor chip and the first conversion element are arranged. The carrier may be a connection carrier, via which the semiconductor chip can be electrically contacted. The carrier may comprise a reflector, which in some places is formed on the top side of the carrier. In this case, the carrier is configured to reflect the primary radiation and the secondary radiation in places where it is covered by the first conversion element.

The carrier is suitable for dissipating heat generated in the semiconductor chip and in the conversion element during operation. Preferably, the semiconductor chip and the first conversion element connect to the carrier in a well heat-conductive manner. For example, the first conversion element may in some places directly adjoin the conversion element. The optoelectronic semiconductor chip may connect to the carrier via a thermally well-conductive brazing material or a thermally well-conductive adhesive.

The first conversion element may be covered by an encapsulation on its external surface at least sectionally, the encapsulation being permeable for primary radiation and secondary radiation. In this case, particularly the entire exposed external surface of the first conversion element, i.e., for example, the part of the external surface not covered by the carrier may be covered by the encapsulation. The encapsulation inhibits or prevents penetration of humidity and/or atmospheric gases into the first conversion element. The encapsulation can e.g. be produced by ALD (Atomic Layer Deposition). For example, the encapsulation may comprise materials such as $Al_2O_3$, $TiO_2$ and/or $ZrO_2$ as monolayers or as part of layer sequences. Furthermore, it is possible that the encapsulation comprises Parylene.

Particularly, the encapsulation with Parylene has proven to be particularly advantageous since the encapsulation may be effected even at room temperature. An encapsulation comprising Parylene or consisting of Parylene preferably has a thickness of at least 20 μm. In this case, encapsulation may comprise different types of Parylene that may be different from one another in terms of their optical refractive index, for example. The encapsulation may then be formed by a Parylene layer sequence, for example, in which the refractive index gradually changes. For example, this allows for an adjustment of the refractive index between the material of the first conversion element and air. Parylene may be applied in layers, e.g. of at least 20 μm, for example, 25 μm, thereby presenting a humidity barrier and effective protection against corrosion of the first conversion element. Parylene is characterized by its good adhesion on various materials and its good transparence for light of greater than 95%. Particularly Parylene D is suitable in the case of an encapsulation with Parylene and for long-term exposure to temperature below 150° C. and outside the primary radiation, the Parylene D having the following structural formula:

with X=H, $R_1$=Cl, $R_2$H, $R_3$=Cl and $R_4$=H. Parylene D has a refractive index of at least 1.65 for visible light. Furthermore, Parylene D is temperature-stable up to 150° C. in continuous operation.

Parylene can be processed at room temperature under vacuum and is free of micro pores and pinholes as from a layer thickness of 2 μm.

Furthermore, Parylene has a good adhesion, particularly on metals such as nickel, gold, copper, silver and aluminum. Parylene F is particularly suitable for applications in which especially high temperatures are reached and in which the Parylene is located in the optical path of the radiation, for example.

The encapsulation may adjoin the carrier and the first conversion element in some places. This way, the encapsulation is capable of protecting the first conversion element in a particularly well manner against humidity and/or atmospheric gas since the first conversion element is covered by the encapsulation even in the region of the contact between the first conversion element and the carrier.

The encapsulation may directly adjoin the deflection element in some places. If the deflection element is a scattering body, for example, formed by application techniques such as potting or pressing, the encapsulation may directly adjoin the deflection element. The encapsulation may then also serve to adjust the refractive index between the first conversion element and the deflection element.

The arrangement may comprise a multitude of optoelectronic semiconductor chips. The optoelectronic semiconductor chips may be optoelectronic semiconductor chips of the same type, for example. The optoelectronic semiconductor chips may be arranged particularly along a virtual line, for example, a straight line. In this case, the conversion element is preferably parallel and arranged on both sides of the virtual line. That is, the semiconductor chips may be arranged in the type of a strip along a virtual straight line. In this case, the first conversion element is also formed by a strip, for example, the strip being arranged on both sides next to the strip of the radiation-emitting semiconductor chip. Such a light-emitting arrangement is particularly suitable for coupling mixed light generated by the light-emitting arrangement into the light guides of display devices or surface light sources.

In the light-emitting arrangements described herein, particularly sensible conversion materials such as so-called quantum dot converters, organic converters, sulfides and/or Sr-containing CaAlSiN-converters may be used. In particular quantum dot converters may be applied as a foil or potted directly onto the carrier. The quantum-dot converters may be arranged in small polymer beads having grain sizes of preferably less than 20 μm or be potted or embedded as such beads. Scattered particles may be present within the beads.

Silicone as matrix material may be used to form the deflection element, with inorganic particles for the scattering of light being introduced therein. Particles made of $SiO_2$ and/or $Al_2O_3$ in small concentrations between at least 0.05 wt % and at most 0.3 wt %, for example, 0.2 wt % are particularly suitable to that end. The particles are characterized by small d50 diameters measured in Q3 from at least 0.3 μm, preferably at least 0.5 μm, to at most 1 μm. The refractive index of the filler particles is preferably selected such that it deviates by at most +/−0.05 from the refractive index of the matrix material, e.g. silicone.

A method of producing a light-emitting arrangement is provided. The light-emitting arrangement described herein can be produced by the method. That is, all features disclosed for the arrangement are disclosed for the method and vice versa. For example, a method described herein comprises the following steps:

First, a carrier is provided, the carrier having a top side. For example, the carrier may have a reflector on its top side and be configured to reflect in this way or the carrier is formed with a reflecting material. In particular, the carrier may be a connection carrier or a composite of connection carriers, via which optoelectronic semiconductor chips can be contacted.

A multitude of first conversion elements is attached on the carrier in a structured manner, wherein the first conversion elements are arranged spaced apart from one another in a lateral direction running parallel to a main extension direction of the carrier, for example. For example, the conversion elements may be attached to be spaced apart from one another by a masking technique or the conversion elements are structured correspondingly from an interconnected layer by a photo technology, for example. Furthermore, it is possible to adhere prefabricated strip-shaped conversion elements.

After that, an encapsulation is applied or attached to the top side of the carrier onto the exposed external surface of the carrier and the exposed external surface of the first conversion elements, the surface not facing the carrier. The encapsulation covers the carrier and the first conversion elements at least sectionally, preferably in each case completely on the exposed external surfaces thereof.

In a further method step, the encapsulation is removed in regions between the first conversion elements. This may in turn be effected by the masking technique.

In another method step, an optoelectronic semiconductor chip is in each case attached between the first conversion elements so that at least one optoelectronic semiconductor chip is arranged between two adjacent conversion elements on the carrier.

In this case, attaching the optoelectronic semiconductor chips can also be performed before attaching the multitude of first conversion elements. This way, a soldering technique can be used to attach the semiconductor chips, which requires higher temperatures than the temperature sensibility of the phosphor(s) in the first conversion element.

Alternatively, the method is performed in the order mentioned above, wherein a conductive adhesive can be used to apply, mechanically attach and electrically contact the optoelectronic semiconductor chips.

Individualization of a multitude of light-emitting arrangements may be performed, wherein each arrangement comprises at least one first conversion element and at least one optoelectronic semiconductor chip. Individualization can be performed or effected at least through the carrier. Furthermore, it is possible that even the deflection element, if formed as a scattering potting compound, for example, is cut through during individualization.

In the following, the light-emitting arrangements as well as the methods described herein are described by examples and the related figures.

Equal, equivalent or similar elements are provided with the same reference numerals in the Figures. The Figures and dimensions of the elements illustrated in the Figures amongst one another are not to be considered as true to scale. Rather, individual elements can be illustrated in an exaggerated size for better illustration and/or understanding.

Figure 1:
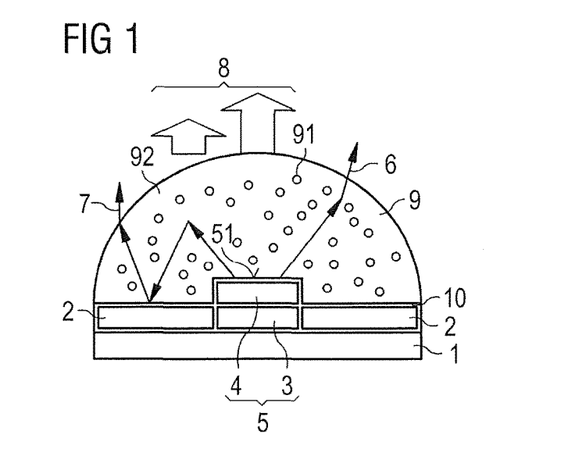
FIGS. 1, 2A, 2B are schematic illustrations showing examples of light-emitting arrangements described herein.

FIG. 1 shows an example of a light-emitting arrangement described herein. The light-emitting arrangement comprises a carrier 1. For example, the carrier 1 is a connection carrier, for example, a printed circuit board.

The semiconductor chip 5 is arranged on the carrier 1. The semiconductor chip 5 comprises a semiconductor body 3 in which electromagnetic radiation is generated by current feed.

Furthermore, the semiconductor chip 5 optionally comprises a second conversion element 4 that may directly adjoin or be adjacent to the semiconductor body 3.

Primary radiation 6 is emitted by the semiconductor chip 5, the radiation being green light or blue-green mixed light, for example. The primary radiation 6 impinges the deflection element 9, which changes the direction of the primary radiation to some extent such that part of the primary radiation impinges a first conversion element 2 arranged laterally next to the optoelectronic semiconductor chip 5 on the carrier 1.

The deflection element 9 is formed as a scattering potting compound comprising a matrix material 92, for example, silicone with light-scattering particles 91, for example, made of aluminum oxide, being introduced therein in a low concentration. The deflection element 9 covers the free external surfaces of the first conversion elements 2 and of the radiation-emitting semiconductor chip 5 entirely, the surfaces facing away from the carrier.

The primary radiation 6 impinging the second conversion element 4 is partially converted into secondary radiation 7 so that mixed radiation 8 composed of primary radiation 6 and secondary radiation 7 exits the light-emitting arrangement through the deflection element 9. The deflection element 9 also ensures a mixing of primary radiation 6 and secondary radiation 7.

In the example of FIG. 1, the deflection element 9 comprises a lens-shaped curvature.

Figure 2A:
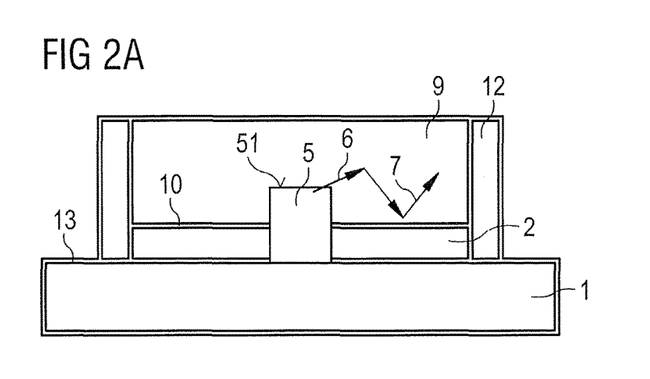
Figure 2B:
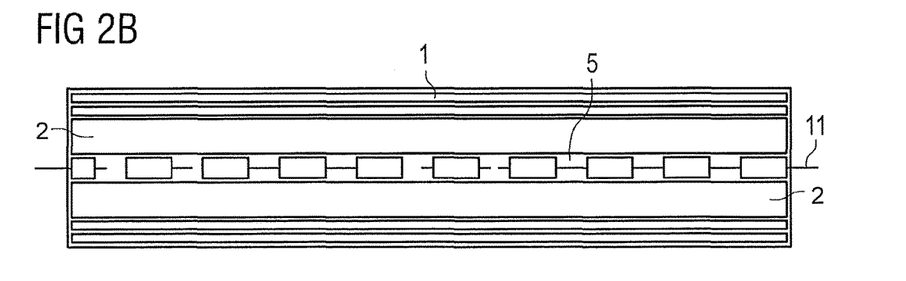

In conjunction to FIGS. 2A and 2B, another example of the light-emitting arrangement described herein is explained in further detail. In this example, a reflector 13 is attached at least on the top side of the carrier 1, the reflector being a metallic reflecting layer, for example. At least the first conversion element 2 is attached on the reflecting layer, i.e. the reflector 13. The conversion element 2 and the optoelectronic semiconductor chip 5 are surrounded by a frame 12 that may be configured to be reflective for the primary radiation 6 and the secondary radiation 7. The primary radiation 6 exits the semiconductor chip 5 through the main emission surface 51 thereof, for example, and will at least partially impinge the first conversion element 2 in a manner deflected by the deflection element 9.

Furthermore, it is possible that the carrier 1 per se has a reflective design and consists of a ceramic, for example, white, material, for example. In this case, arranging another reflector on the top side of the carrier 1 can be omitted. The reflector 13 is rather formed by the external surface of the carrier 1.

The deflection element 9 may in turn be formed as a scattering potting compound that is laterally bounded by the frame 12.

FIG. 2B shows a plan view of the example of the light-emitting arrangement shown in the sectional illustration of FIG. 2A. As can be seen from FIG. 2B, the radiation-emitting semiconductor chips 5 are arranged along a virtual line 11, in this case a straight line. First conversion elements 2 are arranged as strips on both sides of the semiconductor chips 5, and parallel to the straight line 11.

Figure 5:
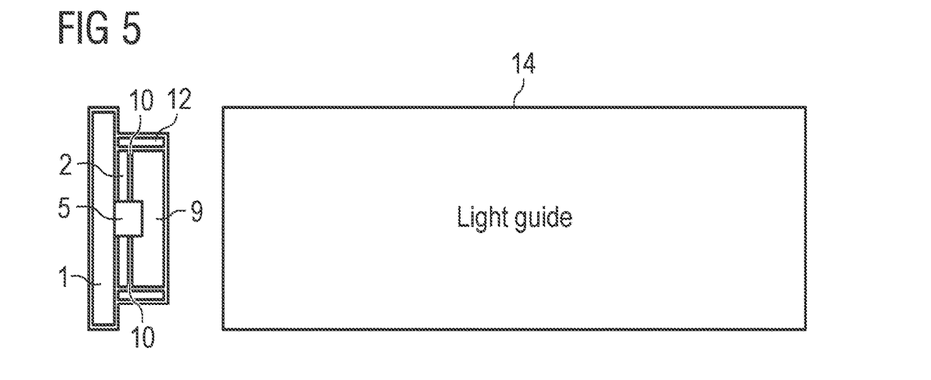
FIG. 5 further shows the use of a light-emitting arrangement described herein.

Such a light-emitting arrangement is suitable for coupling light into a light guide 14, for example, as illustrated in the schematic illustration of FIG. 5. Such a light guide 14 can be used as a surface light source in general lighting systems or in a display apparatus as background lighting device.

In the example of FIGS. 2A and 2B, the first conversion element 2 may particularly be a foil, the foil comprising quantum dots as a phosphor, wherein the foil has a length that may correspond to the edge length of the light guide 14.

Figure 3A:
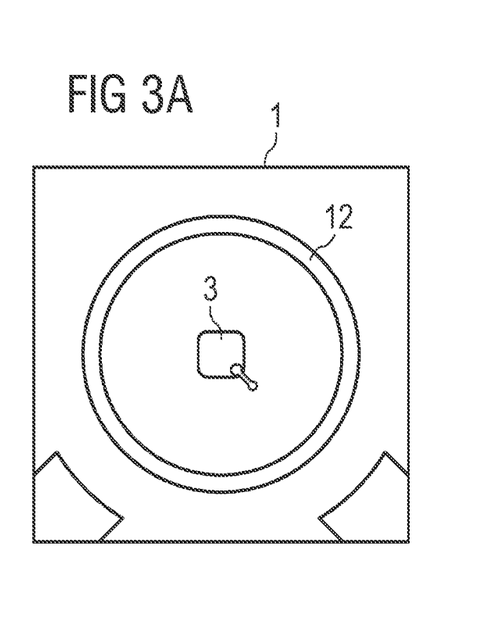
FIGS. 3A through 3D are schematic illustrations further showing an example of the method described herein.
Figure 3B:
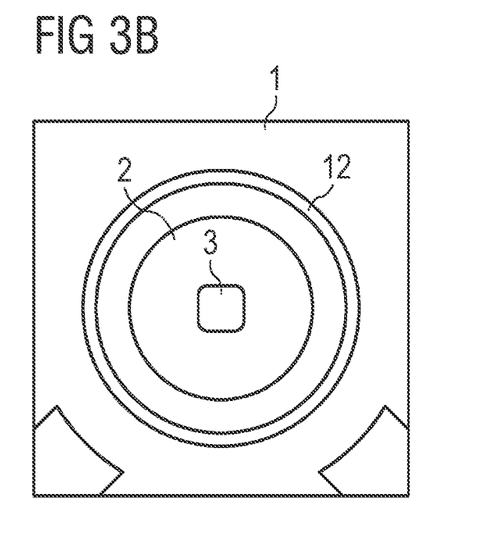

With reference to FIGS. 3A to 3B, a first example of a method described herein is described in greater detail by schematic views. First, a carrier 1 is provided in the method, a semiconductor body 3 of the semiconductor chip 5 that can be electrically pumped and a ring 12 being arranged on the top side of the carrier 1, the ring 12 surrounding the semiconductor body 3. The region around the semiconductor body 3 inside the ring 12 is subsequently filled with material of the first conversion element 2 to form the first conversion element 2. This is illustrated in FIG. 3B.

Figure 3C:
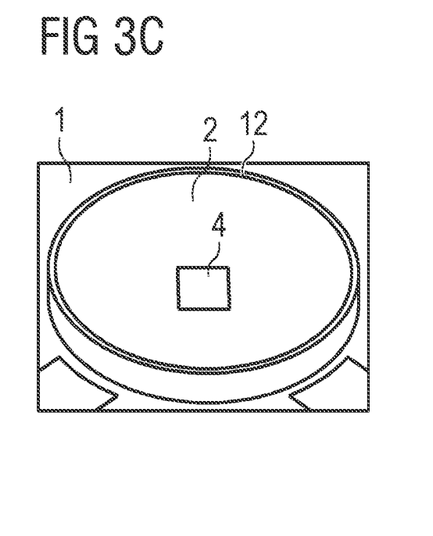

FIG. 3C shows that a second conversion element 4 can be arranged following the semiconductor body 3, the element 4 covering the exposed external surface of the semiconductor body 3.

Figure 3D:
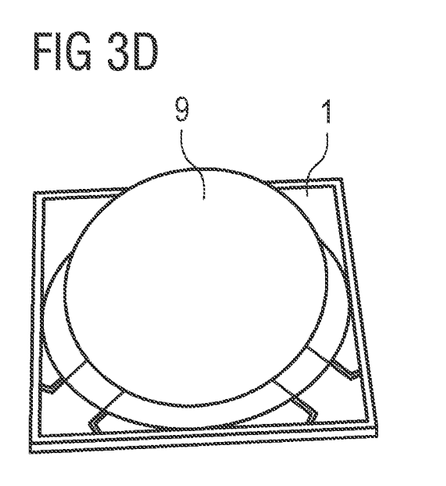

In the final method step, the deflection element 9 is attached over the radiation-emitting semiconductor chip 5 and the first conversion element 2. For example, the deflection element 9 is a potting compound or a lens comprising a matrix material and light-scattering particles.

Figure 4A:
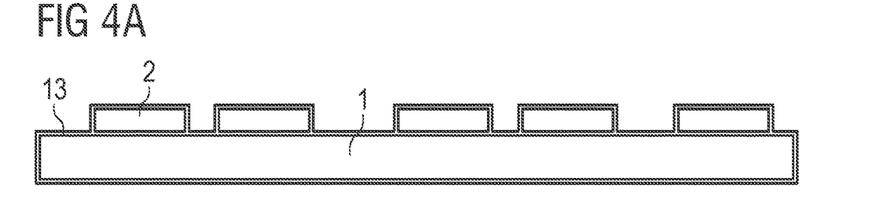
FIGS. 4A through 4C are schematic illustrations further showing another example of a method described herein.
Figure 4B:
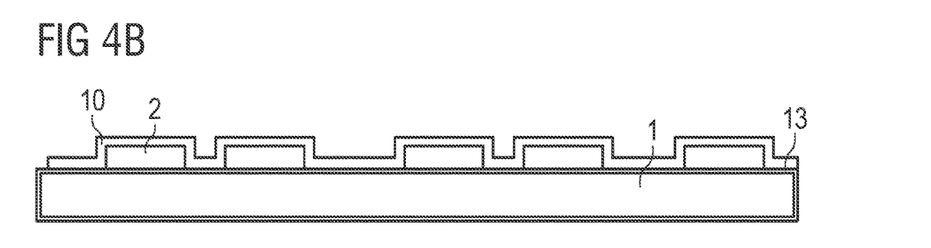
Figure 4C:
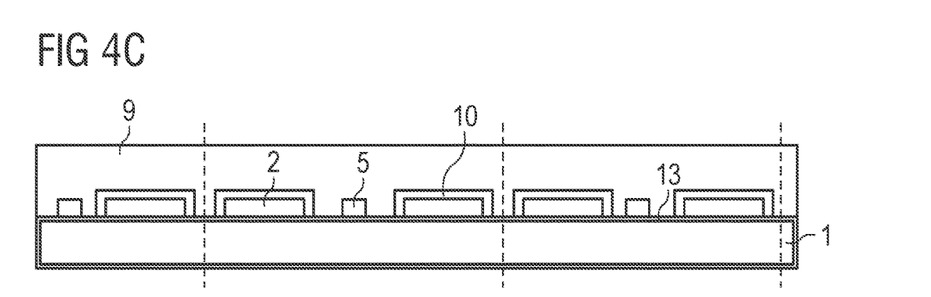

With reference to FIGS. 4A to 4C, another example of a method described herein is explained in further detail. First, first conversion elements 2 are attached to be spaced apart from one another in a lateral direction, parallel to the main extension direction of the carrier 1 on a reflecting carrier 1. The reflecting carrier 1 may be formed of aluminum, for example.

In the next method step, shown in FIG. 4B, attachment of the encapsulation 10 ensues, which may be formed by a laminate, by Parylene and/or inorganic materials applied or attached by atomic layer deposition (ALD). The encapsulation 10 covers the top side of the carrier and the exposed external surface of the first conversion element 2 entirely.

The first conversion elements 2 may contain quantum dots, for example, which may be introduced in beads of a polymer material.

In the next method step, the potting compound 10 is removed in some places and the semiconductor chips 5 are attached. Further, the arrangement is potted with material of the deflection element 9, for example.

Finally, the light-emitting arrangements may be individualized into individual arrangements, which in each case comprise one optoelectronic semiconductor chip, for example.

The method described herein allows producing the light-emitting arrangements described herein, which are characterized by a long life, in a particularly cost-effective manner.

This application claims priority of DE 102014100991.6, the subject matter of which is incorporated herein by reference.

Our arrangements and methods are not limited by the description with respect to the examples. This disclosure rather comprises any new feature as well as any combination of features that particularly includes any combination of features in the appended claims, even if the feature or combination of features per se is not explicitly indicated in the claims or the examples.

The invention claimed is:

1. A light-emitting arrangement comprising:
a plurality of radiation-emitting semiconductor chips that, during operation, each emit primary radiation at least from a main emission surface,
a first conversion element that absorbs part of the primary radiation and emits secondary radiation, and
a deflection element that causes a direction change for part of the primary radiation, wherein
the radiation-emitting semiconductor chips are arranged along a virtual line,
the first conversion element is arranged in a lateral direction next to the radiation-emitting semiconductor chip,
the first conversion element has a strip shape,
the first conversion element is arranged parallel to and on both sides of the virtual line,
the first conversion element continuously extends along two or more of the plurality of radiation-emitting semiconductor chips and is arranged on both sides of said two or more of the plurality of radiation-emitting semiconductor chips,
the deflection element guides part of the primary radiation onto the first conversion element, and
the light-emitting arrangement, in operation, emits mixed light comprising the primary radiation and the secondary radiation.

2. The light-emitting arrangement according to claim 1, wherein the main emission surface of the semiconductor chip is not covered and/or overlapped by material of the first conversion element and the main emission surface is free of material of the first conversion element.

3. The light-emitting arrangement according to claim 2, wherein material of the first conversion element is not directly radiated by the primary radiation and exclusively primary radiation guided via the deflection element impinges material of the first conversion element.

4. The light-emitting arrangement according to claim 1, wherein the semiconductor chip comprises a second conversion element arranged following a semiconductor body of the semiconductor chip, the main emission surface of the semiconductor chip is formed by a region of the second conversion element, and the second conversion element comprises at least one phosphor that is not a constituent of the first conversion element.

5. The light-emitting arrangement according to claim 1, wherein the deflection element comprises a light-scattering body that covers the semiconductor chip and the first conversion element at least in some places.

6. The light-emitting arrangement according to claim 1, having a carrier, the semiconductor chip and the first conversion element arranged on the top side of said carrier.

7. The light-emitting arrangement according to claim 6, wherein the carrier is reflective for the primary radiation and the secondary radiation at least in places covered by the first conversion element.

8. The light-emitting arrangement according to claim 1, wherein the first conversion element on its external surface is at least sectionally covered by an encapsulation, which is permeable for the primary radiation and the secondary radiation.

9. The light emitting arrangement according to claim 8, wherein the encapsulation comprises Parylene and has a thickness of at least 20 μm.

10. The light emitting arrangement according to claim 1, wherein the encapsulation directly adjoins the carrier and the first conversion element in some places.

11. The light-emitting arrangement according to claim 10, wherein the encapsulation directly adjoins the deflection element in some places.

* * * * *